United States Patent
Deboy et al.

(10) Patent No.: US 7,449,777 B2
(45) Date of Patent: Nov. 11, 2008

(54) CIRCUIT ARRANGEMENT COMPRISING A POWER COMPONENT AND A DRIVE CIRCUIT INTEGRATED IN TWO SEMICONDUCTOR BODIES

(75) Inventors: Gerald Deboy, Munich (DE); Marc Fahlenkamp, Geretsried (DE)

(73) Assignee: Infineon Technologies AG, Munich (DE)

(*) Notice: Subject to any disclaimer, the term of this patent is extended or adjusted under 35 U.S.C. 154(b) by 190 days.

(21) Appl. No.: 11/238,677

(22) Filed: Sep. 29, 2005

(65) Prior Publication Data

US 2006/0071237 A1    Apr. 6, 2006

(30) Foreign Application Priority Data

Sep. 29, 2004    (DE) .................. 10 2004 047 358

(51) Int. Cl.
*H01L 23/48*    (2006.01)
(52) U.S. Cl. ....................... 257/723; 438/109
(58) Field of Classification Search ................ 257/133, 257/723, 686, 351, 379; 438/107, 109, 110
See application file for complete search history.

(56) References Cited

U.S. PATENT DOCUMENTS

| | | | | |
|---|---|---|---|---|
| 5,450,288 | A | * | 9/1995 | Tanuma et al. ............... 361/761 |
| 6,147,393 | A | * | 11/2000 | Zommer ...................... 257/501 |
| 6,630,698 | B1 | | 10/2003 | Deboy et al. |
| 6,819,089 | B2 | | 11/2004 | Deboy et al. |
| 6,825,514 | B2 | | 11/2004 | Deboy et al. |
| 6,828,609 | B2 | | 12/2004 | Deboy et al. |
| 6,894,329 | B2 | | 5/2005 | Deboy et al. |
| 6,960,798 | B2 | | 11/2005 | Deboy et al. |
| 2002/0041003 | A1 | | 4/2002 | Udrea et al. |
| 2005/0006758 | A1 | * | 1/2005 | Wolf et al. .................. 257/723 |

FOREIGN PATENT DOCUMENTS

DE    198 40 032 C1    11/1999

OTHER PUBLICATIONS

"TOP232-234 TopSwitch FX Family", Power Integrations, Inc., Jul. 2001, pp. 1-23, (23 pages).
Zitta et al., "SPT4/90V—A Voltage Derivative of the Smart Power Technology Opens the Door to the 42V PowerNet", Infineon Technologies AG, Munich, pp. 1-7, (7 pages).
Tietze et al., "Halbleiterschaltungstechnik", vol. 11, Springer Verlag, 1999, pp. 212-213, (2 pages).
Datasheet ICE3DS01, Version 1.0, May 2003, Infineon Technologies, pp. 1-26, (26 pages).
Datasheet CoolSET™—F3, Version 2.0, Aug. 24, 2005, Infineon Technologies, pp. 1-31, (31 pages).
*Integrated Circuits: iC-Haus Product Guide 1996*. Bodenheim, Germany: Apr. 1996. pp. 1-31.
*Integrated Circuits: iC-Haus Product Guide 2001*. Chapters 5, 6, 8. Bodenheim, Germany: 2001, pp. 5-1 to 5-31; 6-1 to 6-13; 8-1 to 8-25.
Dachroth, Martin. *Kostengunstige E/A-Konzepte fur industrielle Steuerungen*. elektronik industrie, 2002. pp. 32-35.

* cited by examiner

*Primary Examiner*—Roy K Potter
(74) *Attorney, Agent, or Firm*—Maginot, Moore & Beck

(57) ABSTRACT

A circuit arrangement comprises at least one power component and a drive circuit for the power component, which are integrated in a first and a second semiconductor chip. Only CMOS components of the drive circuit or CMOS components, capacitive components and resistance components of the drive circuit are integrated in the first semiconductor chip, and the at least one power component and further components of the drive circuit are integrated in the second semiconductor chip.

20 Claims, 4 Drawing Sheets

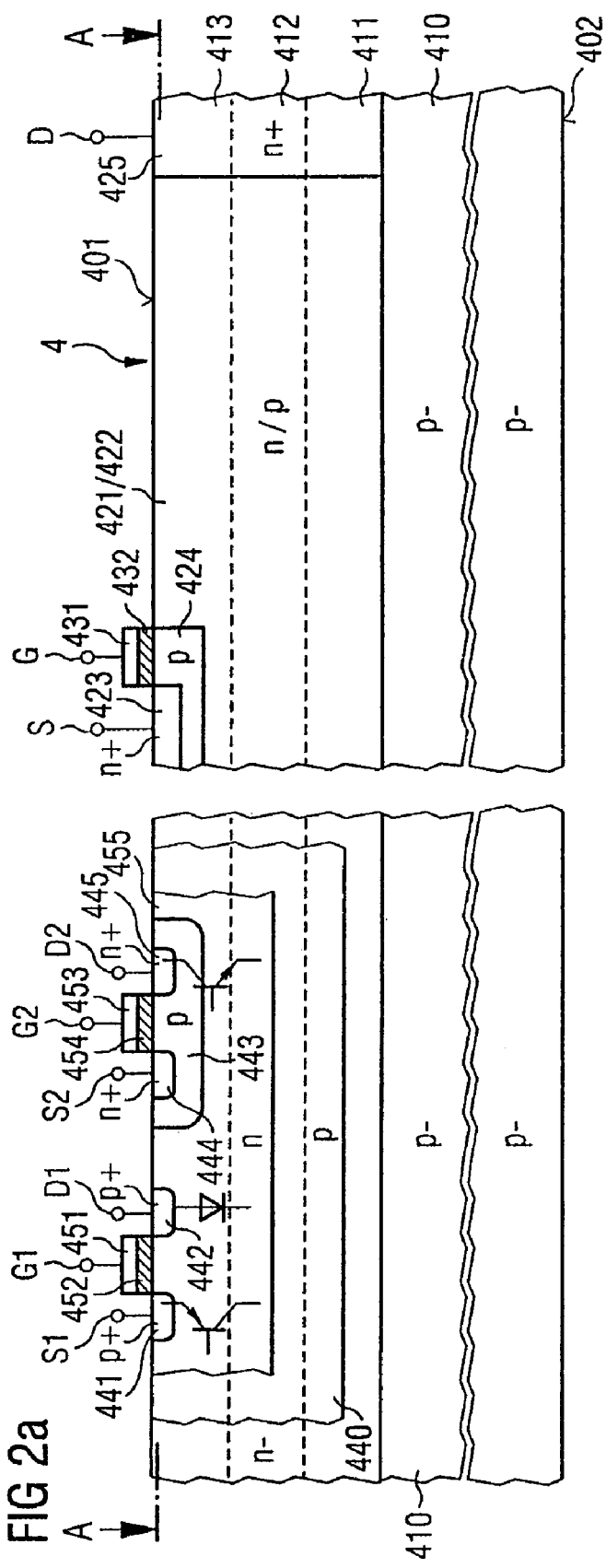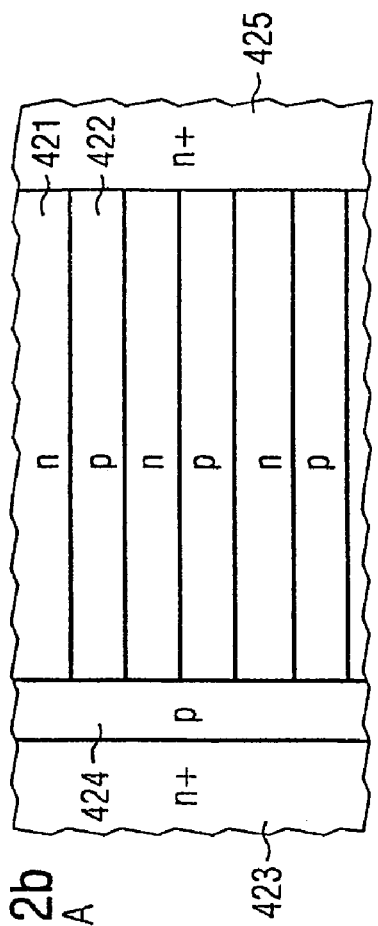

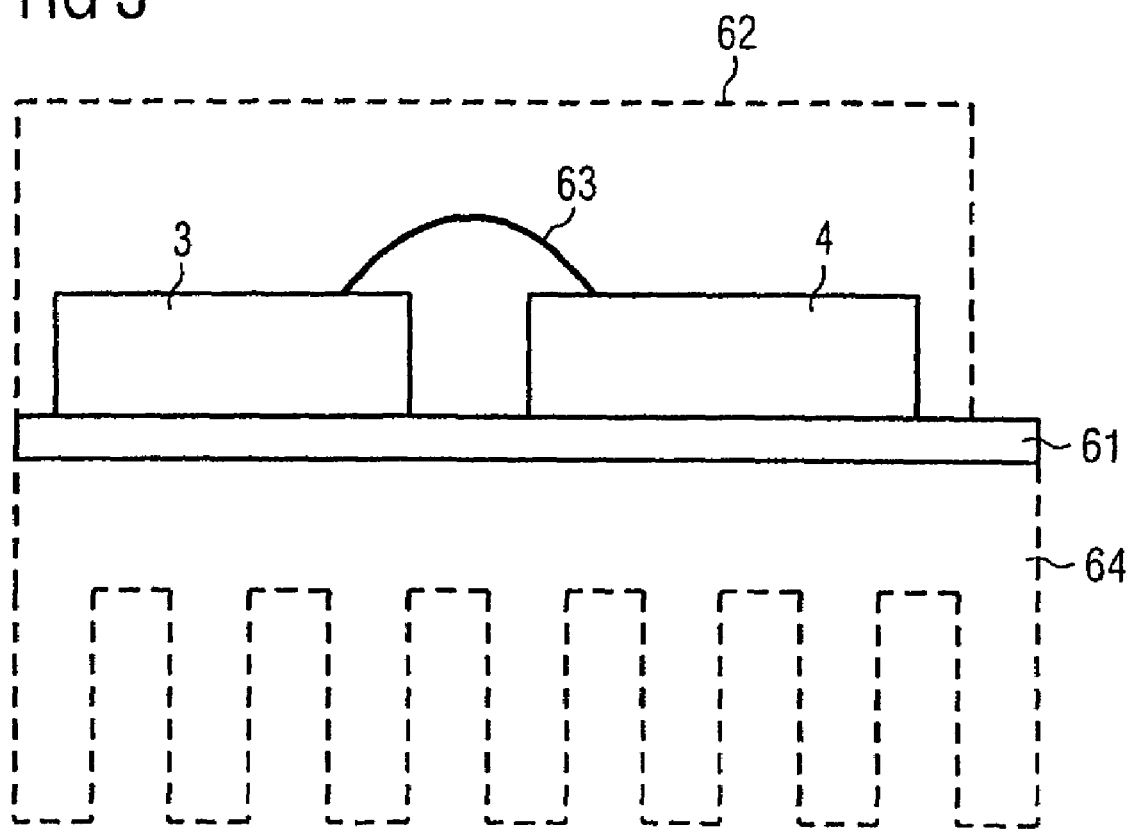

CIRCUIT ARRANGEMENT COMPRISING A POWER COMPONENT AND A DRIVE CIRCUIT INTEGRATED IN TWO SEMICONDUCTOR BODIES

BACKGROUND

The present invention relates to a circuit arrangement comprising at least one power component and a drive circuit for the power component.

Circuit arrangements comprising power components, such as power transistors for example, are in widespread use. Examples thereof are switching converters in which a power transistor is driven by a drive circuit in a clocked manner for regulating the power consumption of the converter, or half-bridge circuits which have two power transistors and which are used for example for driving motors or in lamp ballasts.

Particularly when power components are used for complex switching and regulating operations, such as occur for example in switching converters, in motor drive circuits or in lamp ballasts, complicated drive circuits for driving the power components are required which, in addition to a control function, can also fulfill a protection function for the power component.

Said drive circuits can be integrated together with the power component in a common semiconductor chip. One example of a circuit which is integrated in a chip and comprises both a high-voltage power transistor and the drive circuit thereof is the integrated switched-mode power supply control circuit of the TOP232-234 type from the company Power Integrations, which is described in the data sheet "TOP232-234 TOPSwitch®-FX Family", July 2001. In the case of this circuit, a high-voltage MOSFET, a pulse width modulator for driving the MOSFET and error protection circuits for the MOSFET are integrated, inter alia, as a CMOS circuit in a single chip.

So-called BCD technology (BCD=Bipolar, CMOS, DMOS), which is described, for example, in Zitta et al.: "SPT4/90V—A Voltage Derivative of the Smart Power Technology opens the Door to the 42V PowerNet", Infineon Technologies AG, Munich, makes it possible to integrate not only a power component but also complex control circuits with CMOS components and bipolar components in a single semiconductor chip.

A further method for integrating a power component and a drive circuit in a common semiconductor chip is described in US 2002/0041003 A1.

Methods for integrating a power component and a drive circuit for the power component in a single chip are complicated and cost-intensive since a multiplicity of process steps are required in order to jointly integrate the power component and the drive or logic components, which differ significantly with regard to their dielectric strength. While the dielectric strength of CMOS components in the drive circuit, depending on the supply voltage, must be between 3.3V and 5V, even just 1.1V in future technologies, considerably higher dielectric strengths are demanded for power components. If only because of these different requirements made of the dielectric strength, logic components, for example CMOS transistors, of the drive circuit and the power component, for example a power MOSFET, cannot be produced by means of common method steps. Therefore, separate method steps are required for realizing the logic components and for realizing the at least one power component, which increases the number of masking and deposition steps and thus makes the production method more expensive. Furthermore, when integrating logic and power components in a chip, it is often necessary to make a compromise between the desired properties of the power component and the desired properties of the logic components.

In order to avoid the problems that occur in single-chip circuits, it is known to integrate the power component and the drive circuit thereof in separate chips and to arrange these two chips, if appropriate, in a common chip housing. Examples of such circuits are the integrated circuits of the CoolSET® family from Infineon Technologies AG, Munich. These circuits each have a power MOSFET and the drive circuit thereof, which are integrated in different chips and arranged in a common housing.

A two-chip circuit comprising a power transistor and a drive circuit is also embodied by the switched-mode power supply control circuit of the TEA1208T type from Philips Semiconductors. In this circuit, a power transistor is integrated in one chip by means of a high-voltage SOI process, while the drive circuit thereof is integrated in a second chip. In this case, the drive circuit is integrated in the second chip using a so-called BICMOS process (BICMOS=Bipolar CMOS) and comprises both bipolar components and CMOS components. However, BICMOS processes are expensive and complicated.

It would therefore be advantageous to provide a circuit arrangement comprising at least one power component and a drive circuit or protection circuit for the at least one power component which is optimized with regard to the desired properties of the power component and of the components of the drive circuit and also with regard to the production costs.

SUMMARY

In the case of a circuit arrangement described herein, which has at least one power component and a drive circuit for the power component and which is integrated in a first and a second semiconductor chip, it is provided that only CMOS components of the drive circuit or CMOS components, capacitive components and resistance components of the drive circuit are integrated in the first semiconductor chip, and the at least one power component and further components of the drive circuit are integrated in the second semiconductor chip.

Said further components of the drive circuit are, in particular, bipolar components or components resistant to high voltages with a dielectric strength greater than the dielectric strength of the CMOS components in the first semiconductor body.

An advantage of the partitioning, that is to say of the division of the components of the drive circuit of the power component between the two semiconductor bodies, consists in the fact that the CMOS components of the drive circuit can be integrated in the first semiconductor body by means of conventional standard CMOS processes. Such processes for realizing CMOS components are used globally and can therefore be carried out cost-effectively and are optimized with regard to the properties of the components realized.

Integrated circuits are usually developed and simulated in computer-aided fashion using development and simulation programs, such as SPICE for example. These programs access component libraries in which the component parameters required for the circuit development and simulation are stored with respect to individual components. Since the production method or production process of a component influences the component properties thereof, dedicated component libraries are required for different production methods. For CMOS components produced by means of customary standard processes, there are already extensive libraries for design and simulation programs, such as SPICE for example, so that these libraries can be employed for the circuit development and simulation of the CMOS part of the drive circuit.

In the case of a circuit partitioning, which provides for integrating the CMOS part of the drive circuit, if appropriate together with capacitive components and resistance components, in the first semiconductor body/chip and for integrating the remaining components of the drive circuit together with the power component in the second semiconductor body/chip, costs can be saved to a considerable extent for the development and realization of the CMOS part for the reasons explained above, which costs are incurred again only in part through the integration of the remaining components of the drive circuit in the chip of the power component.

The partitioning of the circuit arrangement according to the invention can be applied to any desired circuit arrangements comprising at least one power component and a drive circuit for the power transistor that can be integrated in a chip. Examples of such circuit arrangements are control circuits for switching converters, ballasts for fluorescent lamps or drive circuits for electric motors.

Depending on the application purpose, the circuit arrangement comprises only one power component, for example a power transistor, or a plurality of power components. A power transistor is required for example as a switch for a switching converter formed as a boost converter. For half-bridge circuits, such as are used in buck converters, drive circuits for motors or in lamp ballasts, by contrast, two power transistors are required, power transistors being understood hereafter to mean either power MOSFETs or power IGBTs. The drive circuits for the power transistors differ, of course, depending on the concrete circuit arrangement. However, any desired drive circuit for a power component which has CMOS components and further circuit components can be partitioned in the manner according to the invention and integrated in two semiconductor bodies. This does not preclude the possibility of individual CMOS components being integrated on the second semiconductor body, too, for example in order to reduce the wiring outlay required for connecting circuit components on one chip to circuit components on the other chip.

The power component is for example a lateral power MOSFET having a source zone, a drift zone, a body zone arranged between the source zone and the drift zone, a drain zone adjacent to the drift zone, and a gate electrode arranged in a manner insulated from the body zone. The power MOSFET is preferably formed as a compensation component, that is to say has complementarily doped semiconductor zones arranged next to one another in the drift zone. Such a component is described in DE 198 40 032 C1, for example.

By means of a process for producing such a lateral compensation component, it is possible, with only little additional outlay, also to integrate bipolar components and CMOS components for the drive circuit in the same semiconductor body as the power component.

The present invention is explained in more detail below with reference to figures.

BRIEF DESCRIPTION OF THE DRAWINGS

FIG. 2 shows a cross section through a semiconductor body in which a power component formed as a lateral power MOSFET, bipolar components and CMOS components are integrated.

FIG. 3 shows a side view of a circuit arrangement according to the invention which is integrated in two semiconductor chips, said semiconductor chips being applied on a common chip carrier and being arranged in a common housing.

DESCRIPTION

Figure 1:
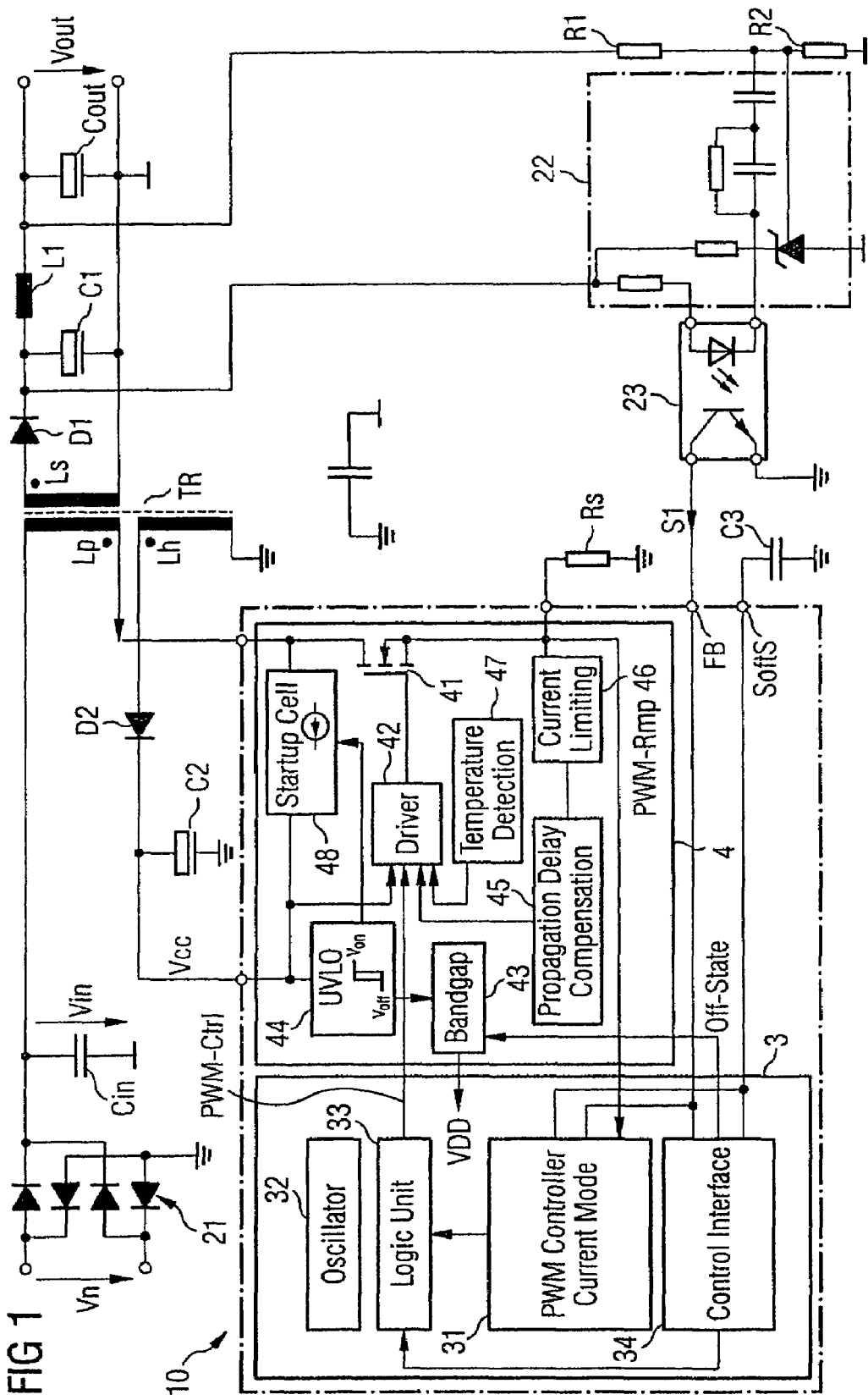
FIG. 1 shows a switching converter with a control circuit comprising a power transistor and a drive circuit for the power transistor, which control circuit is partitioned according to the invention.

The present invention is explained below using the example of a control circuit—the function of which is known in principle—for a flyback converter switched-mode power supply with reference to FIG. 1. With regard to the functioning of individual components of this control circuit, which are illustrated as circuit blocks, reference is made for example to the data sheet of the integrated module ICE3DS01L, version 1.0, May 2003, Infineon Technologies AG, Munich.

The control circuit illustrated has the task of converting an input voltage Vin available at an input capacitor Cin into a regulated output voltage Vout for a load (not specifically illustrated). The input DC voltage Vin is generated from a power supply system AC voltage Vn by means of a bridge rectifier 21, by way of example. The switching converter illustrated has a flyback converter topology and has a transformer TR comprising a primary coil Lp and a secondary coil Ls. In this case, the control circuit 10 has the task of controlling the current flow through the primary coil Lp in a clocked manner such that the output voltage Vout is constant at least approximately independently of the input voltage Vin and the connected load. For regulating the output voltage Vout, the control circuit 10 has a power MOSFET 41 connected in series with the primary winding Lp of the transformer TR. This series circuit with the primary winding Lp and the power MOSFET 41 is in this case connected in parallel with the input capacitor Cin, at which the input voltage Vin is present.

The power MOSFET 41 is driven in a clocked manner by a drive circuit for regulating the output voltage Vout. In this case, the clocked driving of the power transistor 41 is effected in a manner dependent on a regulating signal S1 fed to the control circuit 10, which regulating signal is dependent on the output voltage Vout and is generated by a filter arrangement 22 from a signal dependent on the output voltage Vout and provided by a voltage divider R1, R2, and which regulating signal is transmitted by means of an optocoupler 23 from the secondary side to the control circuit 10 arranged on the primary side.

In the case of the flyback converter illustrated, the output voltage Vout is regulated by way of a regulation of the power consumption of the transformer TR. For the flyback converter illustrated it holds true, in principle, that the primary coil Lp takes up energy when the power MOSFET 41 is driven in the on state, and transmits this energy to the secondary coil Ls when the power MOSFET 41 is subsequently turned off, a voltage present across the secondary coil Ls being rectified by a rectifier and filter arrangement D1, C1, L1, Cout on the secondary side in order to provide the output voltage Vout. The regulating signal S1 dependent on the output voltage Vout determines the power consumption, the power MOSFET 41 being driven by the drive circuit in such a way that the switched-on duration of the power MOSFET is increased compared with the switched-off duration thereof if the power consumption is intended to be increased, and that the switched-on duration is correspondingly reduced if the power consumption is intended to be reduced in order to stabilize the output voltage Vout.

The drive circuit for the power MOSFET 41 comprises a number of different circuit components designated by the reference symbols 31 to 34 and 42 to 48 in FIG. 1. The entire control circuit 10 comprising the power MOSFET 41 and the drive circuit thereof is integrated in two semiconductor chips, which are schematically designated by the reference symbols 3 and 4 in FIG. 1. In this case, the partitioning of the control circuit 10 comprising the power MOSFET 41 and the drive circuit is performed in a manner dependent on the type of components which can be used to realize the individual components of the drive circuit, which are illustrated merely schematically as circuit blocks in the figure. In this case, only circuit components which can be realized using CMOS technology are integrated on the first semiconductor chip 3, one embodiment of the invention also providing for not only CMOS components but also capacitive components and resistances of the drive circuit to be integrated on the first semiconductor chip 3. The power MOSFET 41 and the circuit components of the drive circuit which cannot be realized using CMOS technology are integrated on the second semiconductor chip 4. Such components are bipolar components or components resistant to high voltages, for example, for which a dielectric strength is required which is greater than the dielectric strength of the components that can be realized using CMOS technology.

The circuit components of the drive circuit which can be realized using CMOS components are integrated on the first semiconductor chip 3. They are, in particular, logic circuit blocks having comparators, flip-flops or logic gates, including current sources. Such components such as comparators, flip-flops, logic gates or current sources can be realized using CMOS technology in a sufficiently known manner. In the example in accordance with FIG. 1, the CMOS chip 3 comprises four circuit blocks of the drive circuit, namely an oscillator 32, a logic unit 33, a pulse width modulator 31 and an interface circuit 34.

Figure 4:
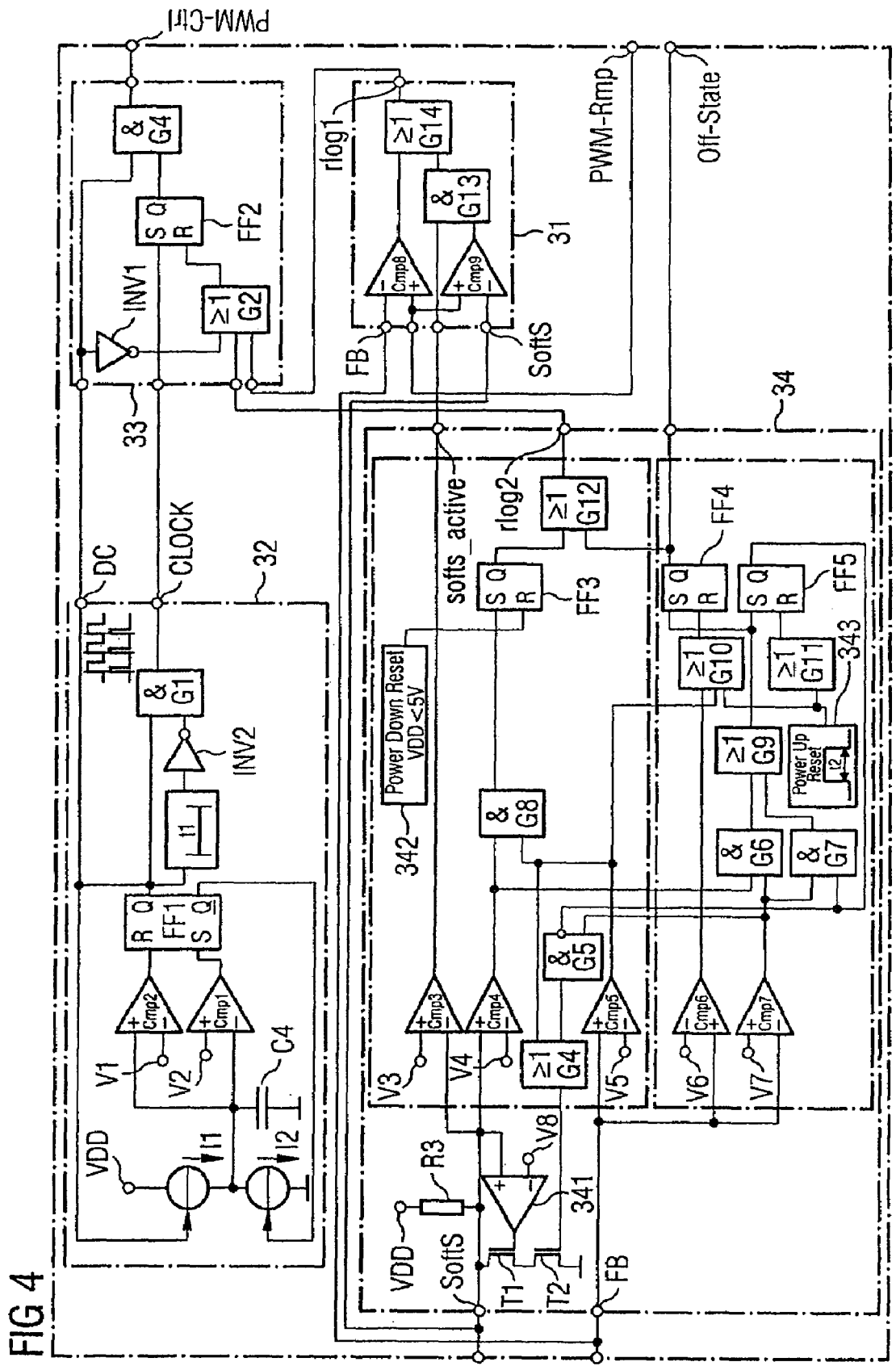
FIG. 4 shows an exemplary realization at the gate level for the CMOS part of the drive circuit in accordance with FIG. 1.

FIG. 4 shows by way of example an exemplary realization at the gate level for the individual functional blocks 31-34 of the drive circuit 3.

As can be seen, said functional blocks are realized by flip-flops FF1-FF5, comparators Cmp1-Cmp9 and logic gates G1-G14, which can be realized by means of n-channel and p-channel MOSFETS using CMOS technology in a sufficiently known manner. The reference symbol 341 in FIG. 4 designates an operational amplifier which can likewise be realized using CMOS technology.

What can likewise be realized using CMOS technology are current sources I1, I2 of the oscillator circuit 32 and also the more complex circuit blocks 342 and 343 of the interface circuit, which respectively provide for a shutdown (power down reset) in the event of an excessively low supply voltage and a reactivation (power up reset) in the event of a sufficient supply voltage.

Capacitances C4 and resistances R3 can likewise be realized in circuits using CMOS technology, it being possible to realize capacitances for example in accordance with gate-source capacitances of MOSFETs and resistances as sections made of polysilicon.

The delay element 321 of the oscillator circuit 32 can likewise be realized using CMOS technology.

In the second chip 4, a driver circuit is integrated together with the MOSFET 41, which driver circuit converts a control signal supplied by the pulse width modulator 31 integrated in the CMOS chip 3 to a signal suitable for driving the power MOSFET 41. The level of the signal required for driving the power MOSFET 41 lies above the logic level of the CMOS circuit 3, so that the driver circuit 42 must have a greater dielectric strength than the circuits on the CMOS chip 3 and is therefore integrated on the second chip 4 together with the power MOSFET. It should be pointed out in this connection that the driver circuit 42 may contain MOS components, for example, which, however, are dimensioned such that their dielectric strength is higher than the MOS components on the CMOS chip 3. There is furthermore realized on the second semiconductor chip 4 a reference voltage source 43, for example a band gap circuit, which supplies the supply voltage for the CMOS chip 3 and is usually realized using bipolar transistors in a known manner. In the example, a protection circuit 44 is additionally integrated on the second semiconductor chip 4, which protection circuit monitors the supply voltage Vcc, from which the reference voltage source 43 generates the reference voltage, in order to prevent the driving of the power MOSFET 41 in the event of a decrease in the supply voltage Vcc below a predetermined value. Furthermore, a thermal protection circuit 47 is integrated on the chip 4 with the power MOSFET 41, which thermal protection circuit is likewise usually realized using bipolar transistors or diodes and serves for detecting the temperature on the power chip 4 in order to prevent the driving of the power MOSFET 41 by means of the driver circuit 42 if the temperature exceeds a predetermined value. Furthermore, a current limiting circuit 46 is integrated on the chip 4, which current limiting circuit, by means of an externally connected current measuring resistor Rs connected in series with the power MOSFET 41, detects the load current through the primary coil Lp in order, by means of a delay compensation circuit 45, if appropriate to turn off the power MOSFET 41 upon detection of an excessively large load current.

Furthermore, a startup circuit 48 is integrated in the second semiconductor chip 4 with the power MOSFET 41, which startup circuit ensures that voltage is supplied to the control circuit 10 during a starting phase.

The fundamental construction and the functioning of these circuit components that are integrated together with the power MOSFET 41 in the second chip 4 are described for example in the data sheet ICE3DS01L, version 1.0, May 2003, from Infineon Technologies AG Munich, or in the data sheet CoolSET™-F3, version 1.2, May 21, 2004.

In the example, the voltage supply of the control circuit 10 is ensured by means of an auxiliary winding Lh coupled to the primary winding Lp in conjunction with a rectifier arrangement D2, C2.

The fundamental structure of a semiconductor chip 3 with integrated CMOS components is known, in principle. In this respect, reference is made for example to Tietze, Schenk: "Halbleiterschaltungstechnik" ["Semiconductor circuitry"], 11th edition, Springer Verlag, 1999, ISBN3-540-64192-0, pages 212 and 213.

Refering to FIG. 2, the power MOSFET is preferably formed as a lateral power MOSFET with a compensation structure. FIG. 2a shows in the right-hand part, in cross section, a detail from this semiconductor body 4 in which such a lateral power MOSFET is realized. A section through the sectional plane A-A depicted in FIG. 2a in the region of the power MOSFET is illustrated in FIG. 2b.

In the example, the semiconductor body 4 has a weakly p-doped semiconductor substrate 410, to which a plurality of semiconductor layers 411-413 are applied epitaxially, in which the structure of the power MOSFET is realized. In the example, the MOSFET is formed as an n-conducting MOSFET and has an n-doped first semiconductor zone 425, which forms the drain zone of the MOSFET and which, in the example, reaches from a front side 401 of the semiconductor body as far as the p-doped substrate 410. Adjacent to this drain zone 425 is a second semiconductor zone forming the drift zone of the MOSFET. Said second semiconductor zone comprises semiconductor zones 421, 422 doped complementarily following the compensation principle, which are arranged adjacent to one another and, in the example, are formed in strip-type fashion and extend in each case from the front side 401 as far as the substrate 410. The source zone of the MOSFET is formed by an n-doped third semiconductor zone 423, which is separated from the drift zone 421, 422 by means of a p-doped fourth semiconductor zone 424 forming the body zone. A gate electrode 431 is arranged adjacent to the body zone 424 in a manner insulated from the semiconductor body 401, which gate electrode serves for generating an n-conducting channel in the body zone 424 between the source zone 423 and the drift zone 421, 422 upon application of a suitable drive potential. In the example, the gate electrode 431 is arranged above the front side 401 of the semiconductor body 4 and is insulated from the semiconductor body by an insulation layer 432.

The fabrication of the differently doped zones in the individual epitaxial layers 411, 412, 413 for producing the component structure illustrated is effected in a sufficiently known manner in that, in each case after the deposition of an epitaxial layer having an n-type basic doping, for example, dopant atoms are implanted for producing the differently doped component zones. In this case, the implanted dopants are outdiffused after the conclusion of the epitaxy steps by heating the semiconductor body 4. The n-doped regions 422 of the drift zone are for example regions having a doping that corresponds to the basic doping of the epitaxial layers, while for the more heavily n-doped regions such as the drain zone 425 and the source zone 423 and for the p-doped regions of the drift zone 422 and the body zone 424, dopant atoms are implanted into the epitaxial layers and outdiffused.

By means of the method steps that lead to the fabrication of the power MOSFET structure, namely by means of the epitaxy steps and the doping steps, bipolar components and also CMOS structures can be produced in other regions of the semiconductor chip 4. FIG. 2a shows in the left-hand part a detail from this semiconductor body 4 in which CMOS components, namely a p-conducting MOSFET and an n-conducting MOSFET, are integrated. In the example, the CMOS structures are arranged in the topmost epitaxial layers 413, the component structures being surrounded by a p-doped well 440 in order to insulate the components from further component structures (not specifically illustrated) by means of a pn junction. The p-conducting MOSFET comprises heavily p-doped drain and source zones 441, 442, a gate insulation 452 arranged on the front side 401 of the semiconductor body, and also a gate electrode 451. The n-conducting MOSFET comprises a p-doped semiconductor zone 443, which is arranged in the topmost epitaxial layer and in which are arranged heavily n-doped source and drain zones 444, 445 spaced apart from one another in the lateral direction. A gate insulation 454 is arranged on the front side 401 of the semiconductor body, on which the gate electrode 453 is in turn situated.

The p-doped well 440 surrounding the CMOS structure can be fabricated during the same method steps during which the p-doped pillars 422 of the drift zone of the power MOSFET are fabricated. The p-doped well 443 surrounding the structure of the n-channel MOSFET can be fabricated during the same method steps during which the body zone 424 of the power MOSFET is fabricated. Correspondingly, the n-doped source zones of this n-conducting MOSFET can be fabricated during the same method steps during which the source zone 423 of the power MOSFET is fabricated.

However, the method just explained cannot be used to realize highly complex integrated CMOS circuits on the power chip since component structures having extremely small structure widths such as are attained in special CMOS chips cannot be realized by means of the method explained.

As is illustrated in FIG. 2 on the basis of component symbols for bipolar components, bipolar components such as diodes or bipolar transistors can also be produced in the power MOSFET chip 4 by means of the method steps explained. As can be seen from the example of the drain zone 441 of the p-conducting MOSFET and the surrounding n-doped zone 455, a diode can be fabricated in a simple manner by fabricating a p-doped zone 441 in an n-doped section 455 surrounded by a p-type well 440, said p-doped zone forming the p-type emitter of the diode or the anode thereof, while the n-doped zone 455 forms the n-type emitter or the cathode of the diode. A vertical pnp bipolar transistor can be produced in a simple manner by fabricating a p-doped zone in the n-doped zone 455, said p-doped zone forming the collector or emitter of the bipolar transistor, the n-doped zone 455 forming the base of the bipolar transistor, and the well that surrounds the n-doped zone 455 forming the emitter or collector of the bipolar transistor. A vertical npn bipolar transistor can be fabricated in a corresponding manner by producing an n-doped zone in a p-doped well within the n-doped zone 455, as can be seen on the basis of the semiconductor zones 443 and 445 in FIG. 2. The n-doped zone 445 then forms the emitter or collector of said npn bipolar transistor, the p-doped zone 443 forms the base and the n-doped zone 455 forms the collector or emitter of said bipolar transistor.

During operation of the power component chip, the semiconductor substrate 410 is preferably at the lowest potential that occurs in the circuit, usually the source potential of the power MOSFET.

Referring to FIG. 3, the CMOS chip and the power component chip are preferably mounted on a common carrier 61 and surrounded by a common chip housing (illustrated by dashed lines). If the semiconductor substrate 410 of the power component chip is at the lowest potential that occurs in the circuit, for example ground, the rear side 402 of the power component chip may be electrically conductively connected to the carrier 61, which is tantamount to a good thermal connection between the power component chip 4 and the carrier 61. In this case, the carrier 61 can be utilized for cooling the power component chip 4, and for this purpose is preferably applied to a heat sink, which is likewise illustrated by dashed lines in FIG. 3. CMOS chips are usually also based on a p-type substrate which is at the lowest potential that occurs in the circuit, for example ground. In this case, the CMOS chip 3 may likewise be electrically conductively connected to the carrier 61, which is tantamount to a good cooling of the CMOS chip 3 by the heat sink.

The reference symbol 63 in FIG. 3 designates by way of example one of a plurality of bonding wires which connect the circuit structures on the CMOS chip 3 to the circuit structures on the power component chip 4.

LIST OF REFERENCE SYMBOLS

10 Control circuit
21 Bridge rectifier
22 Filter
23 Optocoupler
3 CMOS chip
31 Pulse width modulator circuit
32 Oscillator circuit
33 Logic circuit
34 Interface circuit
341-343 Components of the interface circuit
4 Power component chip
401 Front side of the semiconductor body
402 Rear side of the semiconductor body
410 p-type substrate
411-413 Epitaxial layers
42 Driver circuit
421 n-doped zones of the drift zone
422 p-doped zones of the drift zone
423 Heavily n-doped semiconductor zone, source zone
424 p-doped semiconductor zone, body zone
425 Heavily n-doped semiconductor zone, drain zone 43 Reference voltage circuit
431, 451, 453 Gate electrodes
432, 452, 454 Gate insulation layers
44 Supply voltage evaluation circuit
440 p-doped semiconductor zone
441, 442 Heavily n-doped semiconductor zones, source, drain zones
444 p-doped semiconductor zone, body zone
444, 445 Heavily n-doped semiconductor zones
45 Delay compensation circuit
455 n-doped semiconductor zone
46 Current limiting circuit
47 Temperature detection circuit
48 Startup circuit
61 Chip carrier, leadframe
62 Chip housing
63 Bonding wire
64 Heat sink
C1-C3 Capacitors
C4 Capacitor
Cin Input capacitor
Cmp1-Cmp9 Comparators
Cout Output capacitor
D1 Diode
G1-G14 Logic gates
L1 Inductance
Lh Auxiliary winding of the transformer
Lp Primary winding of the transformer
Ls Secondary winding of the transformer
R1, R2 Voltage divider, source/drain zones
TR Transformer
Vin Input voltage
Vn Power supply system voltage
Vout Output voltage
VDD Supply voltage

The invention claimed is:

1. A circuit arrangement including at least one power component and a drive circuit operable to drive the at least one power component, the circuit arrangement comprising:
    a first semiconductor chip, wherein only CMOS components of the drive circuit or CMOS components, capacitive components and resistance components of the drive circuit are integrated in the first semiconductor chip; and
    a second semiconductor chip, wherein the at least one power component is integrated in the second semiconductor chip and wherein further components of the drive circuit not integrated in the first semiconductor chip are integrated in the second semiconductor chip.

2. The circuit arrangement of claim 1, wherein the further components of the drive circuit comprise bipolar components.

3. The circuit arrangement of claim 1, wherein the further components of the drive circuit comprise components resistant to predetermined high voltages with a dielectric strength greater than the dielectric strength of the CMOS components.

4. The circuit arrangement of claim 1 wherein the at least one power component is a power MOSFET.

5. The circuit arrangement of claim 1 wherein the at least one power component is a lateral power MOSFET comprising a source zone, a drift zone, a body zone arranged between the source zone and the drift zone, a drain zone adjacent to the drift zone, and a gate electrode arranged in a manner insulated from the body zone.

6. The circuit arrangement of claim 5 wherein the drift zone includes complementarily doped semiconductor zones arranged next to one another.

7. The circuit arrangement of claim 6 wherein the complementarily doped semiconductor zones extend into the second semiconductor chip in a vertical direction proceeding from a front side of the second semiconductor chip.

8. The circuit arrangement of claim 1 wherein the drive circuit is a drive circuit operable to drive a power transistor in a switching converter.

9. The circuit arrangement of claim 1 wherein the power components comprise at least two power MOSFETs connected as a half-bridge.

10. The circuit arrangement of claim 9 wherein the drive circuit is a drive circuit for driving a half-bridge in a lamp ballast.

11. A method of arranging a circuit including at least one power component and a drive circuit, the method comprising the steps of:
    providing a first semiconductor chip, wherein only CMOS components of the drive circuit or CMOS components, capacitive components and resistance components of the drive circuit are integrated in the first semiconductor chip;
    providing a second semiconductor chip, wherein the at least one power component is integrated in the second semiconductor chip and wherein further components of the drive circuit not integrated in the first semiconductor chip are integrated in the second semiconductor chip; and
    connecting the first semiconductor chip and the second semiconductor chip.

12. The method of claim 11 further comprising the step of mounting the first semiconductor chip and the second semiconductor chip on a common carrier.

13. The method of claim 12 further comprising the step of surrounding the first semiconductor chip and the second semiconductor chip by a common housing.

14. The method of claim 11, wherein the further components of the drive circuit comprise bipolar components.

15. The method of claim 11, wherein the further components of the drive circuit comprise components resistant to high voltages with a dielectric strength greater than the dielectric strength of the CMOS components.

16. A circuit arrangement comprising:
    a first semiconductor chip comprising a first set of components of a drive circuit, wherein the first set of components consist of components integrated by CMOS processes; and
    a second semiconductor chip connected to the first semiconductor chip, the second semiconductor chip comprising at least one power component and a second set of components of the drive circuit, wherein the drive circuit is operable to drive the at least one power component.

17. The circuit arrangement of claim 16 wherein the components integrated by CMOS processes include CMOS components, capacitive components, and resistance components of the drive circuit.

18. The circuit arrangement of claim 16 further comprising a common carrier, wherein the first semiconductor chip and the second semiconductor chip are mounted on the common carrier.

19. The circuit arrangement of claim 16 further comprising a common housing, wherein the first semiconductor chip and the second semiconductor chip are surrounded by the common housing.

20. The circuit arrangement of claim 16 wherein the second set of components of the drive circuit comprise bipolar components.

* * * * *